(12) United States Patent
Sanghani (10) Patent No.: US 6,477,684 B1
(45) Date of Patent: Nov. 5, 2002

(54) AUTOMATIC TEST PATTERN GENERATION MODELING FOR LSSD TO INTERFACE WITH MUXSCAN

(75) Inventor: Amit D. Sanghani, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 98 days.

(21) Appl. No.: 09/611,734

(22) Filed: Jul. 7, 2000

(51) Int. Cl.⁷ .............................................. G06F 17/50
(52) U.S. Cl. .................... 716/4; 716/5; 716/6
(58) Field of Search .................. 716/1–21; 714/721, 714/726; 710/5, 54, 55, 112, 307; 702/117, 121; 365/207, 221; 345/3, 221, 504, 519, 540, 542, 545; 324/158, 537, 753, 763, 765

(56) References Cited

U.S. PATENT DOCUMENTS 6,008,821 A * 12/1999 Bright et al. ................ 345/504

* cited by examiner

Primary Examiner—Vuthe Siek
Assistant Examiner—Naum Levin
(74) Attorney, Agent, or Firm—Rosenthal & Osha L.L.P.

(57) ABSTRACT

A model of a LSSD storage element and non-LSSD storage element interface for use with an automatic test pattern generator has been developed. The model includes a master element, a slave element, and a master observe module. The master observe module alternatively selects the input signal for the master element and the output signal from the slave element.

17 Claims, 6 Drawing Sheets

AUTOMATIC TEST PATTERN GENERATION MODELING FOR LSSD TO INTERFACE WITH MUXSCAN

BACKGROUND OF THE INVENTION

Digital integrated circuits often include a number of storage elements such as latches and flip-flops that temporarily store logical states (e.g., HIGH or LOW) within the integrated circuit. In normal operation, data from a component of the integrated circuit is received by the storage elements and then outputted to the same and/or another component of the integrated circuit. Sometimes, it is useful to selectively set the data stored in the storage elements in order to operate the integrated circuit from a known logical state.

Similarly, it is also useful to shift an entire sequence of bits into the storage elements to test the integrated circuit. In the latter case, two or more storage elements are "daisy-chained" together so the output of one feeds the input of the next, and so on. To begin the "shift", one of the storage elements in the chain is tapped, that is, selected as the point at which to shift in the controlled test bits. Similarly, a sequence of bits can be shifted out from the integrated circuit and compared with an expected output. This technique of shifting data bits in is also referred to as "scanning" while the technique of shifting data bits out is called "capture". The chain of storage elements is referred to as a "scan chain." A common software tool called an automatic test pattern generator ("ATPG") is used to generate the test patterns used to test the integrated circuit.

Figure 1A:
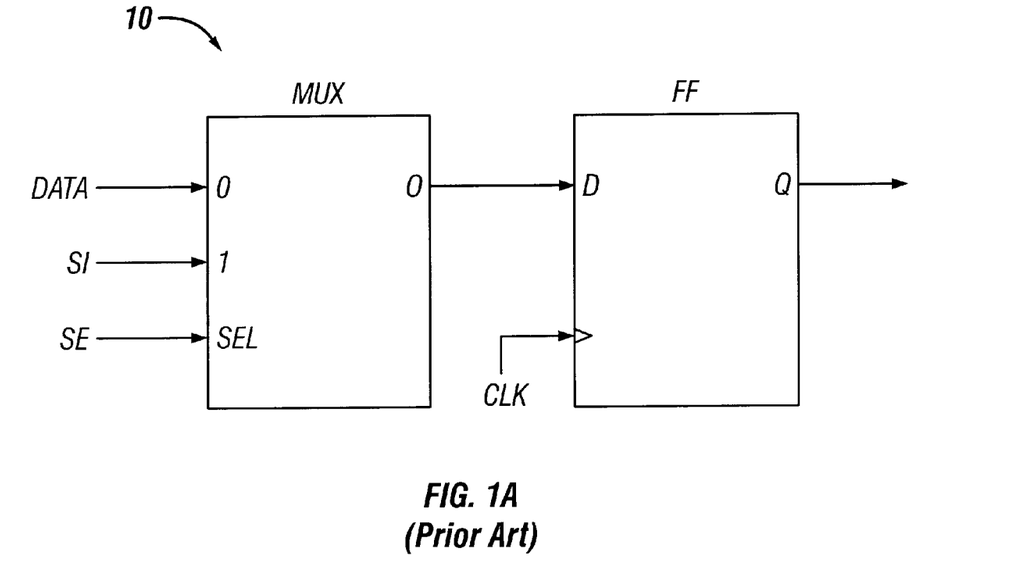
FIG. 1A is functional diagram of a prior art Muxscan storage element.

One common type of storage element is a Muxscan storage element 10, depicted in FIG. 1A as a multiplexer MUX connected to a flip-flop FF. The multiplexer MUX has two inputs 0 and 1 which are selectable via a select input SEL, and an output O. The 0 and 1 inputs are typically connected to a data signal DATA and a scan-in signal SI, respectively, and the select input SEL is typically connected to a scan-enable signal SE. The DATA signal carries logic states from a predefined component of the integrated circuit during normal operation.

The scan-in signal SI provides logic states from a tester for purposes of testing the integrated circuit. When the scan-enable signal SE is at logic LOW, the multiplexer MUX selects the DATA signal as the output. When the scan-enable signal SE is at logic HIGH, the multiplexer MUX selects the SI signal as the output. The output O is connected to an input D of the flip-flop FF, which also has a data output Q. In operation, upon assertion of a clock signal CLK, the flip-flop FF latches whatever data are at its input D (from either the DATA or SI signal) and outputs this data at the output Q.

Figure 1B:
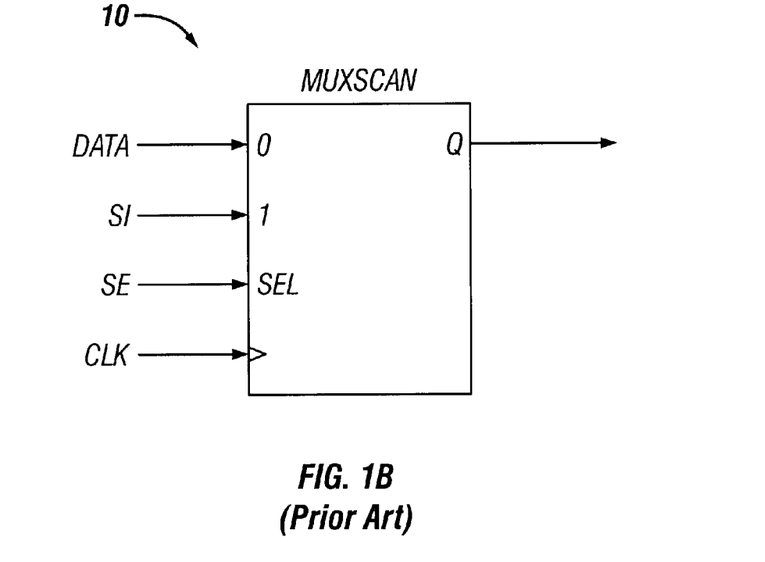
FIG. 1B is an alternative function diagram of a prior art Muxscan storage element.

FIG. 1B shows a simplified version of the Muxscan storage element 10 of FIG. 1A. The multiplexer MUX and the flip-flop FF of FIG. 1A have been combined into a single device that is functionally identical to the device shown in FIG. 1A.

Another type of storage element is the Level-Sensitive Scan Design, or LSSD. Generally, LSSD storage elements have an advantage over non-LSSD storage elements in that their operation does not depend on the exact timing of a clock signal. Instead, operation of an LSSD storage element depends solely on whether the clock signal has occurred (i.e., whether it has attained a certain, predefined voltage level, and not on when the clock signal has occurred). This insensitivity to exact timing avoids timing related problems such as clock skew and rise or fall times dependencies. However, LSSD storage elements have more stringent design requirements. For example, each latch in an LSSD storage element must have its own clock signal, and the clock signals may not overlap.

Figure 2:
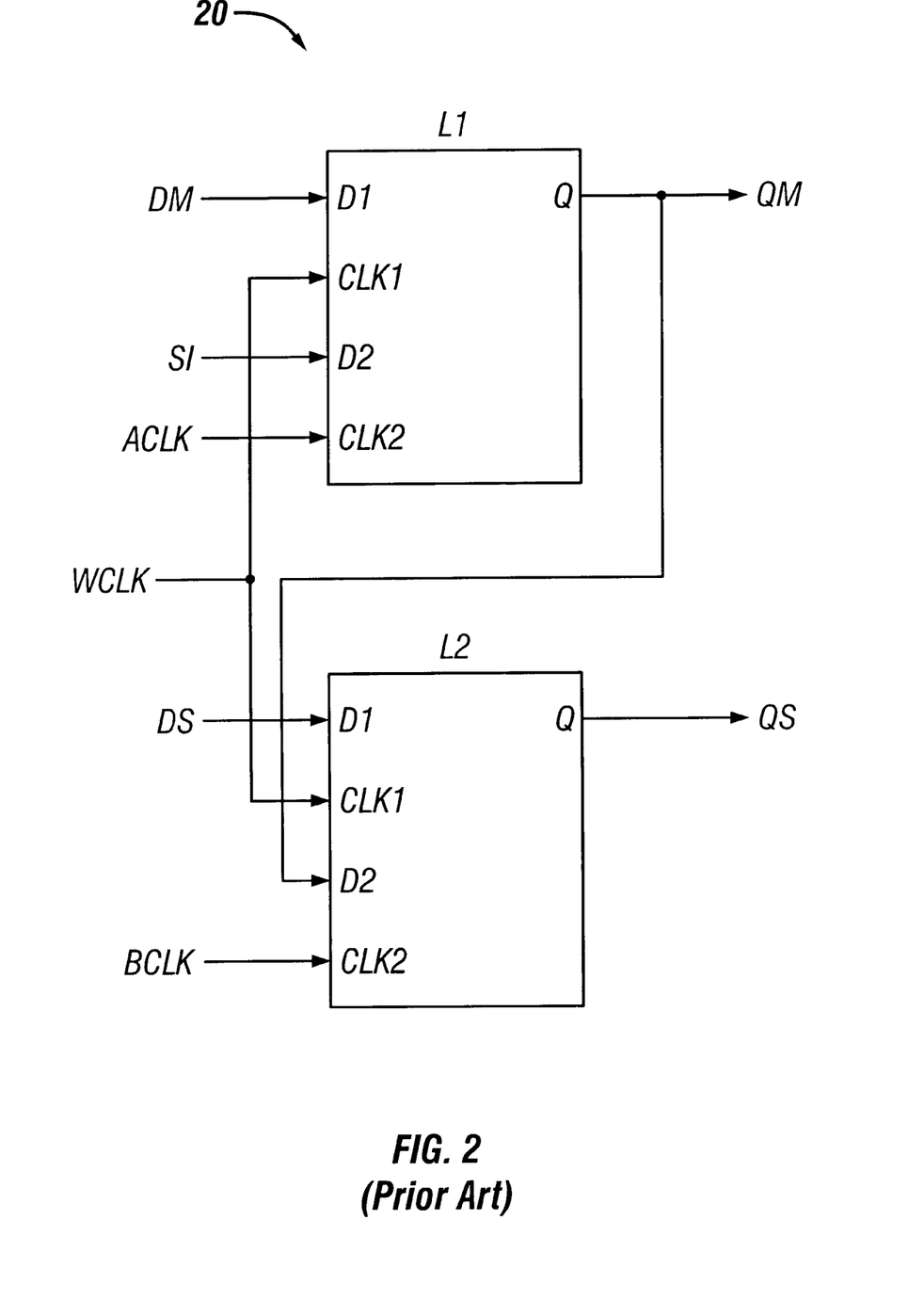
FIG. 2 is a functional diagram of a prior art LSSD storage element.

A popular type of LSSD storage element called an "L2-Star" is functionally depicted in FIG. 2. This storage element 20 has a master latch L1 and a slave latch L2 connected together. Both latches L1 and L2 have a set of inputs D1 and D2 which are latched by clock inputs CLK1 and CLK2, respectively. An output Q outputs the data from either the D1 or D2 input (whichever is latched last) on both latches L1 and L2. The master latch L1 outputs a master output signal QM and the slave latch L2 outputs a slave output signal QS. The input D1 of the master latch L1 is connected to a data signal DM carrying logic states from a predefined component of the integrated circuit, while the corresponding input D1 of the slave latch L2 is connected to another data signal DS. A write clock signal WCLK global to the integrated circuit is connected to the clock inputs CLK1 of both latches L1 and L2 for latching the data from the DM and DS signals. The input D2 of the master latch L1 is connected to a scan-in signal SI carrying logic states from, for example, a tester, for purposes of testing the integrated circuit. The corresponding input D2 of the slave latch L2 is connected to the master output signal QM from the master latch L1. A master scan clock ACLK latches the data from the scan-in signal SI and a slave scan clock BCLK latches the data from the QM signal.

Figure 3:
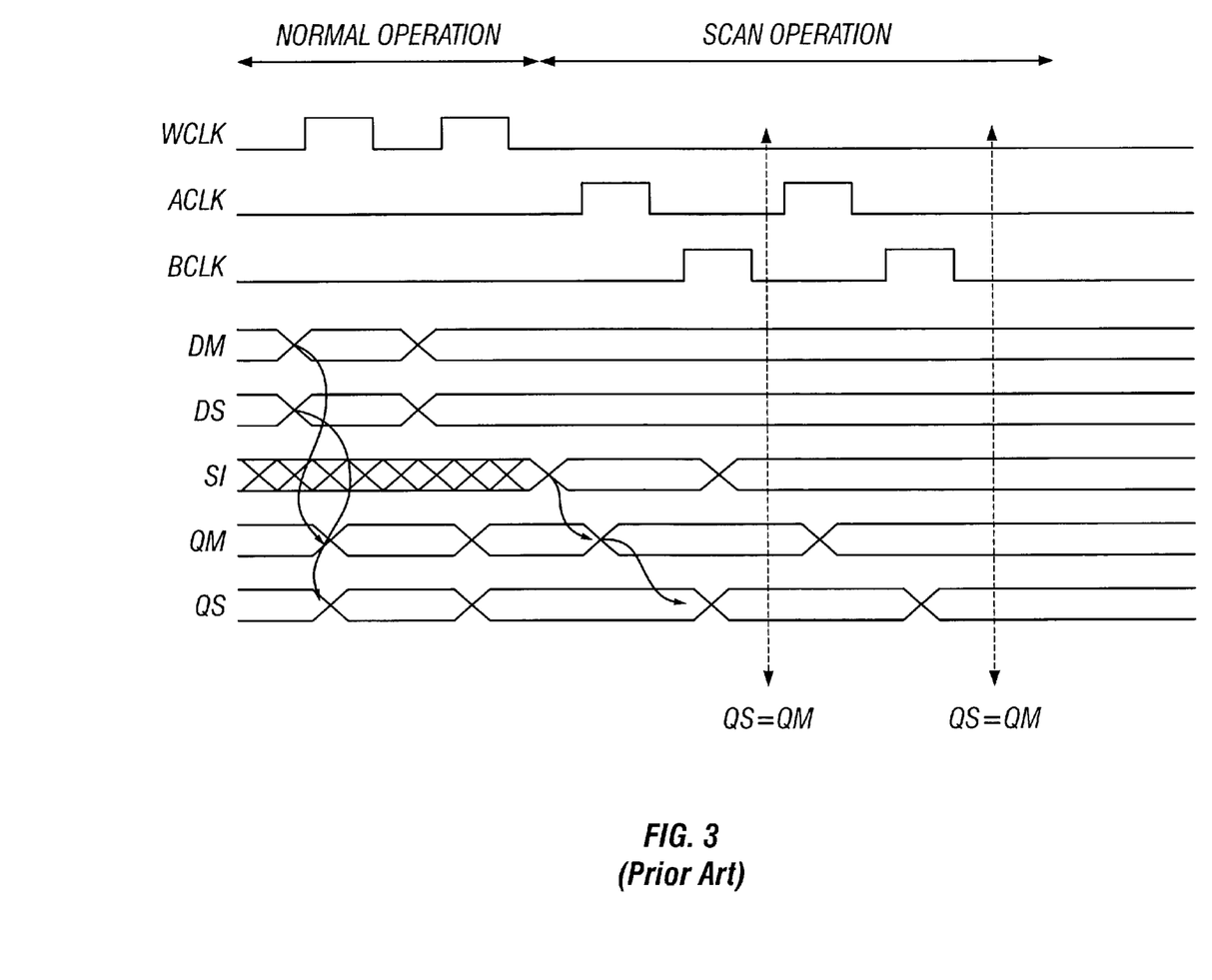
FIG. 3 is a timing diagram for the LSSD storage element of FIG. 2.

Operation of the LSSD storage element 20 will now be described with reference to the timing diagram of FIG. 3. During normal operation, the master latch L1 and the slave latch L2 both function as independent storage elements. Upon assertion of the write clock WCLK, data carried by the signals DM and DS are latched by the two latches L1 and L2 and outputted as the output signals QM and QS, respectively. Note that the two scan clocks ACLK and BCLK are inactive at this time, and the scan-in signal SI is in a "don't care" state.

During testing, or scan operation, the master latch L1 and the slave latch L2 operate together to form a 2-position shift register. Upon assertion of the master scan clock ACLK, the data from the scan-in signal SI is latched by the master latch L1 and outputted as the master output signal QM. This same data will then be latched by the slave latch L2 upon assertion of the slave scan clock BCLK and outputted as the slave output signal QS. Note, for proper operation of the scan function, the two scan clocks ACLK and BCLK must not overlap each other. Also, note that at the end of the scan operation, these outputted signal bits stored in the latches are always equal (i.e., QM=QS).

As can be seen from the timing diagram, the L2-Star configuration uses both latches L1 and L2 as independent storage elements during normal operation. However, during scan operation, the master latch L1 feeds the slave latch L2 and the latches are no longer independent. As such, in a scan chain made of multiple L2-Star storage elements, asserting the master scan clock ACLK first at the start of the scan operation destroys the initial data bit going into the input D2 of the slave latch L2. Likewise, asserting the slave scan clock BCLK first destroys the initial data bit going into input D2 of the following master latch L1. By way of example, say the scan-in signal SI is HIGH at the start of the scan operation while the master output signal QM is LOW. Upon assertion of the master scan clock ACLK, the HIGH from the scan-in signal SI is latched by the master latch L1 and the master output signal QM becomes HIGH, thus displacing the previous LOW before it can be latched by the slave latch L2. A similar displacement occurs at the next master latch in the scan chain if the slave scan clock BCLK is asserted first. Therefore, each scan operation would have to be executed twice, once with the master scan clock ACLK asserted first, and once with the slave scan clock BCLK asserted first, in order to capture all the data.

SUMMARY OF THE INVENTION

In one embodiment, the invention relates to an apparatus for circuit modeling for use with an automatic test pattern generator of a level sensitive scan design storage element and a non-level sensitive scan design storage element comprising: a master element that receives a master input signal; a slave element that generates a slave output signal; and a master observe control module that alternatively selects the master input signal from the master element and the slave output signal from the slave element.

In another embodiment, the invention relates to an apparatus for circuit modeling for use with an automatic test pattern generator of a level sensitive scan design storage element and a non-level sensitive scan design storage element comprising: means for modeling a level sensitive scan design storage element; means for modeling a non-level sensitive scan design storage element; and means for modeling the interface between the level sensitive scan design storage element and the non-level sensitive scan design storage element.

In another embodiment, the invention relates to a method of modeling a level sensitive scan design storage element and a non-level sensitive scan design storage element for testing with an automatic test pattern generator comprising: generating a slave output signal from a slave element; generating a master input signal for a master element; and alternatively selecting the slave output signal and the master input signal with a master observe control module.

The advantages of the disclosed invention include an efficient test generation that avoids multiple passes of the scan operation for a LSSD storage element and a non-LSSD storage element.

DETAILED DESCRIPTION OF THE INVENTION

Exemplary embodiments of the invention will be described with reference to the accompanying drawings. Like items in the drawings are shown with the same reference numbers.

Before the details of the modeling is described, it is useful to state some assumptions used in the models. First, each embodiment of the model is configured to make the ATPG tool understand the design for testing purposes. It is only an abstract version of the real circuitry. Second, a hardware interface between a LSSD device and a Muxscan device exists and is employed. Third, the LSSD write clock is always out of phase with the Muxscan clock. Fourth, in the LSSD device, the master observe clock signal always precedes the slave observe clock signal.

In the embodiments of the present invention, there can be two types of models: explicitly clocked and implicitly clocked. Each embodiment of these models will produce the same results but they differ in the way the ATPG tool works with each. The clock signal in the "explicit" model is controlled by the ATPG tool as governed by the user. In the "implicit" model, the clock signal is assumed to be inherently present.

Figure 4:
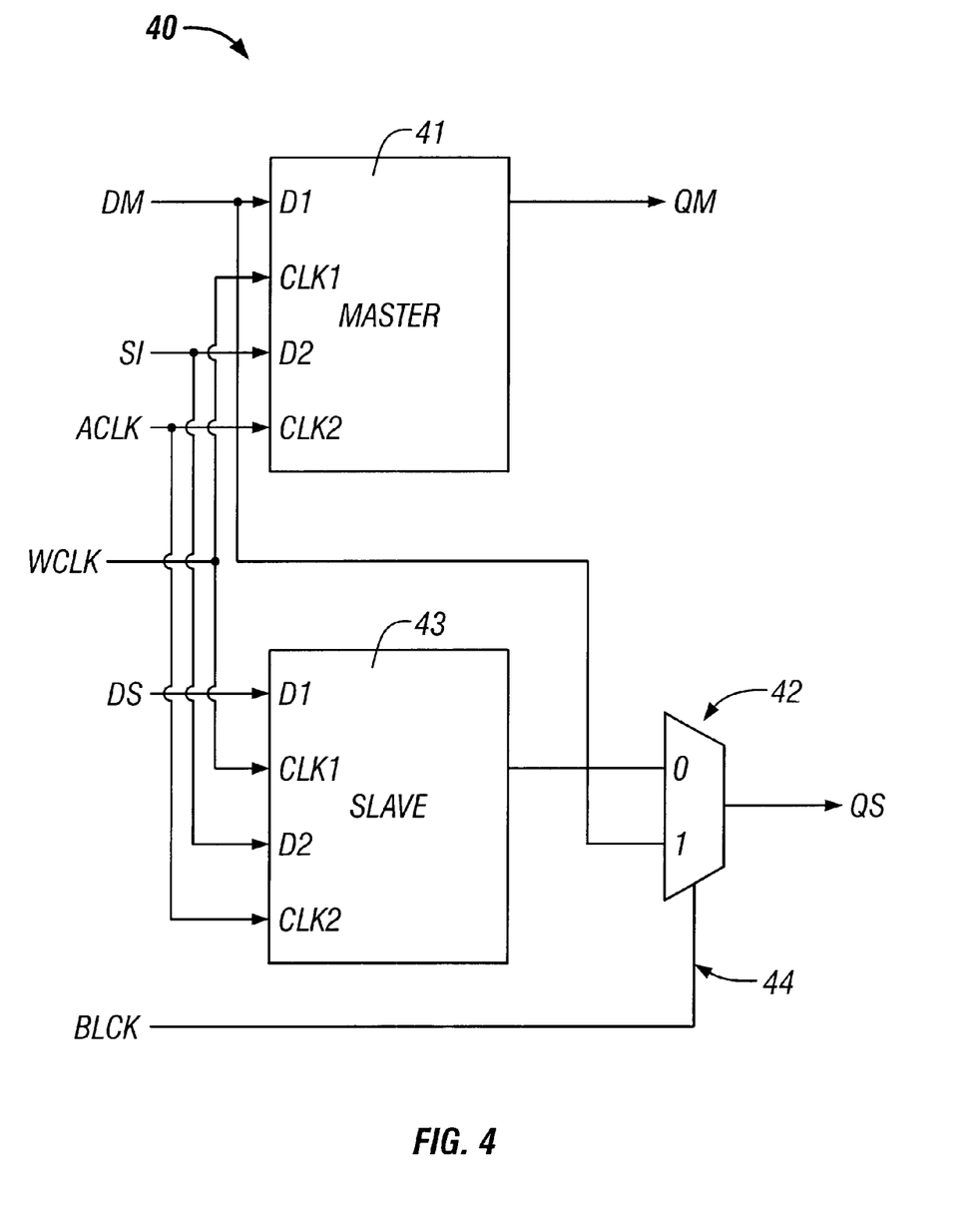
FIG. 4 is a functional diagram of one embodiment of the explicitly clocked model of the present invention.

In FIG. 4, one embodiment of the explicitly clocked model is shown. The model includes: a master element 41, a slave element 43, and a master observe module 42. In the embodiment shown, the master element 41 and slave element 43 are comparable to the L1 latch and L2 latch respectively as shown in FIG. 2. Also in this embodiment, the master observe module 42 is a standard multiplexer which is well known in the art. Other components that perform the same functions (e.g., flip-flops), could be used in alternative embodiments. In this embodiment, the master observe control module 42 represents a hardware interface. This hardware interface is necessary for the ATPG tool to control the master observe signal.

As with the L2 star configuration shown in FIG. 2, the master element 41 and the slave element 43 may function as independent storage elements during normal operations. Upon assertion of the WCLK (write clock) signal, the data signals DM (data master) and DS (data slave) are latched by the master and slave elements respectively. They output the data as QM (master output) and QS (slave output).

During testing, the function of the model can best be described as a SCAN sequence and a CAPTURE sequence. As with the L2 Star configuration shown in FIG. 3, the data values in the master and slave elements will always be the same (i.e., QS=QM) at the end of the SCAN sequence. This is because the ACLK (master observe clock) will always precede the BCLK (slave observe clock). However, in alternative embodiments, the BCLK could always precede the ACLK. In either embodiment, the last element to get updated has its data value duplicate the data value of the first updated element. This configuration of clocking signals provides the advantage of simplifying the model such the ACLK alone is sufficient to activate the scan sequence for both the master and slave elements. Additionally, the SE (scan enable) signal may be tied together for scan sequence data input to both the master and slave elements. Also, the data values for the master and slave elements are edge-triggered. The result of this embodiment basically hides the BCLK and relies totally on the ACLK signal. This allows the ATPG to recognize only one shift per scan sequence.

Figure 5:
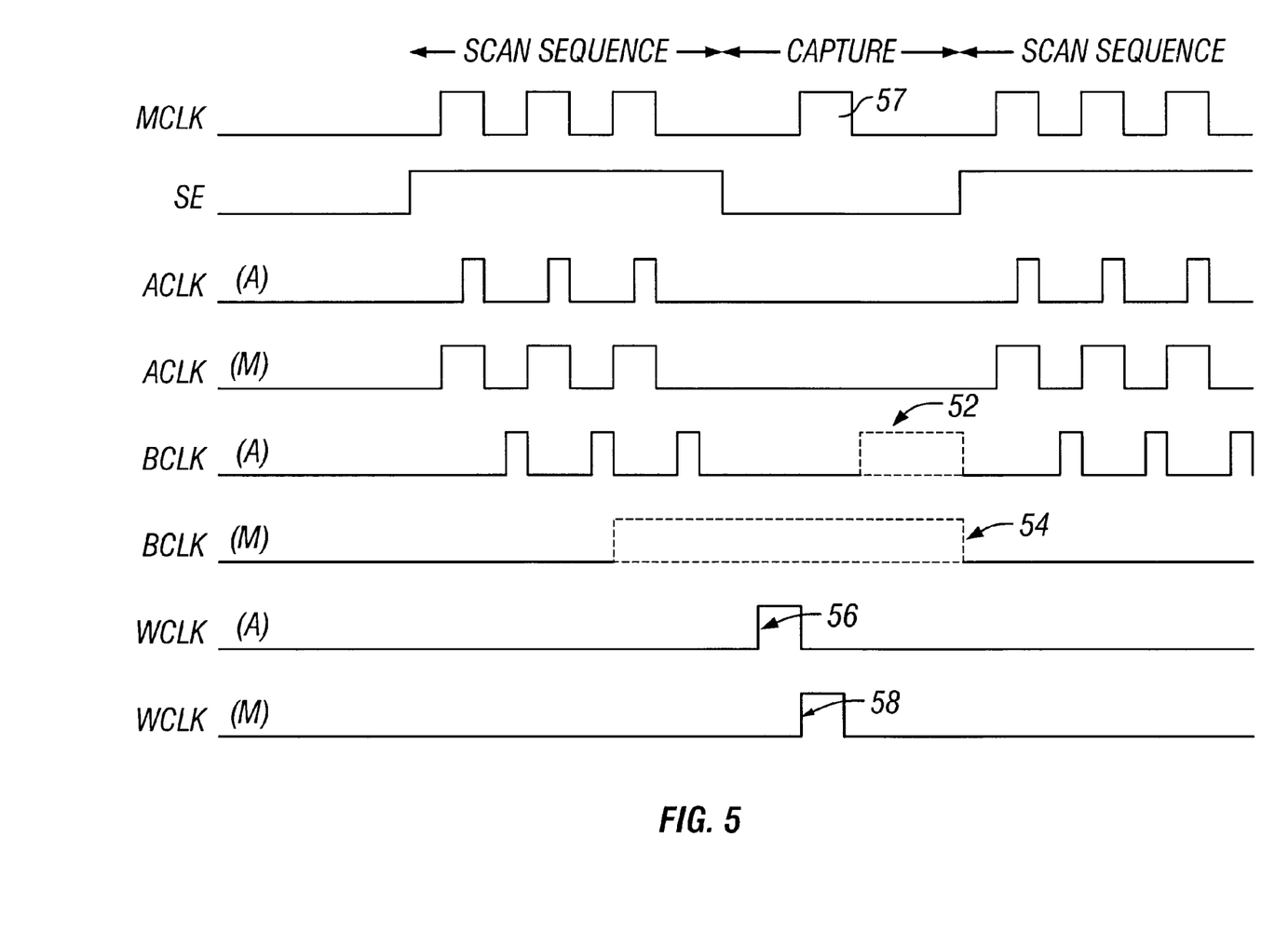
FIG. 5 is a timing diagram of the explicitly clocked model of FIG. 4.

FIG. 5 shows a timing diagram of the actual and model clock signals for the circuit. The actual signals are indicated by an (A) while the model signals are indicated by an (M). The timing patterns for ACLK, BCLK, and WCLK are shown with their actual and model sequences. Also shown is the SE data as well as the MCLK (model clock) for the explicitly clocked embodiment of the invention. At the top of the diagram, the SCAN and CAPTURE sequences are also shown.

During the CAPTURE sequence, WCLK (write clock) will trigger an update in the master and slave elements with the QM and QS data. As shown in FIG. 5, WCLK (M) 58 is in phase with MCLK 57 and out of phase with WCLK (A) 56. This avoids hold/setup violations across the two different methodologies of storage elements. BCLK (M) 54 is used to generate the master observe sequence 44 for the master observe module 42 which is controlled by the ATPG tool via a hardware interface of the master observe module. This allows the tool to efficiently craft out test vectors with high fault coverage in one single pass by controlling the specifics of the master observe sequence.

The overall result is that ACLK is used during the SCAN sequence while WCLK and BLCK are asleep. Conversely, WCLK and BCLK are used during the CAPTURE sequence while ACLK is asleep. During CAPTURE, WCLK is used as a regular clock signal while BCLK is used as a control signal to enable the master observe sequence.

Figure 6A:
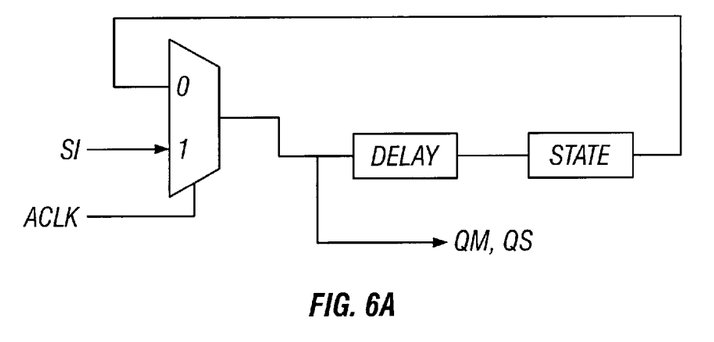
FIG. 6A is a functional diagram of one embodiment of the SCAN model of the implicitly clocked model of the present invention.
Figure 6B:
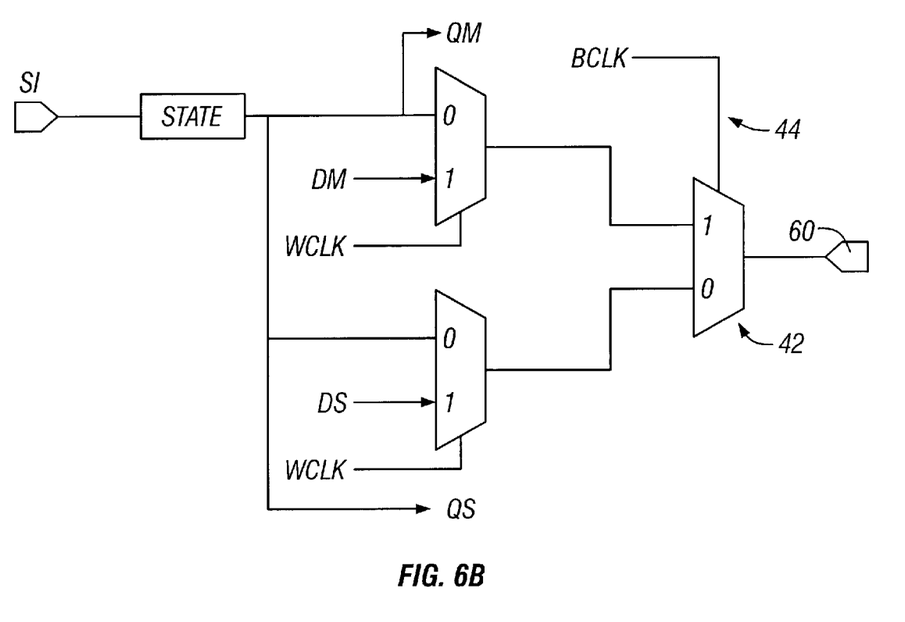
FIG. 6B is a functional diagram of one embodiment of the CAPTURE model of the implicitly clocked model of the present invention.

The implicitly clocked model uses the same concepts as the explicit model and will produce the same results. However, the model is broken down into two separate and distinct parts for the SCAN and CAPTURE sequences. FIG. 6A shows a schematic of the SCAN sequence model. FIG. 6B shows a schematic of the CAPTURE sequence model. The model for the SCAN sequence in FIG. 6A uses the simplification of showing only the ACLK and the SI signal. The STATE element of the drawing represents where the ATPG tool stores the current data. The model for the CAPTURE sequence in FIG. 6B is similar in appearance to the explicitly clock model as shown in FIG. 4. It is the same master observe module 42 that is controlled by the BCLK signal 44. A pseudo-scan out probe 60 is used to allow the ATPG tool to determine the output of the master observe module 42.

The advantages of the disclosed invention may include efficient test generation that avoids multiple passes of the scan operation for a LSSD storage element and a non-LSSD storage element.

While the invention has been disclosed with reference to specific examples of embodiments, numerous variations and modifications are possible. Therefore, it is intended that the invention not be limited by the description in the specification, but rather the claims that follow.

What is claimed is:

1. An apparatus for circuit modeling for use with an automatic test pattern generator of a level sensitive scan design storage element and a non-level sensitive scan design storage element comprising:
   a master element that receives a master input signal;
   a slave element that generates a slave output signal; and
   a master observe control module that alternatively selects the master input signal from the master element and the slave output signal from the slave element, wherein the master observe control module is a flip-flop circuit.

2. The apparatus of claim 1, wherein the master observe control module models the interface between the level sensitive scan design storage element and the non-level sensitive scan design storage element.

3. The apparatus of claim 1, wherein the master observe control module alternatively selects the master input signal and the slave output signal upon assertion of a slave observe clock signal.

4. The apparatus of claim 3, wherein the slave element generates the slave output signal upon assertion of a master observe clock signal.

5. The apparatus of claim 4, wherein the slave observe clock signal and the master observe clock signal are generated by a single clock.

6. The apparatus of claim 5, wherein the slave observe clock signal and the master observe clock signal are non-overlapping signals.

7. An apparatus for circuit modeling for use with an automatic test pattern generator of an L2 Star storage element and a Muxscan storage element comprising:
   a master latch that receives a master input signal upon assertion of a write clock signal;
   a slave latch that generates a slave output signal upon assertion of a master observe clock signal;
   a master observe control module that models an interface between the L2 Star storage element and the Muxscan storage element,
   wherein the master observe control module alternatively latches the master input signal from the master latch and the slave output signal from the slave latch upon assertion of a slave observe clock signal, and
   wherein the master observe control module is a flip-flop.

8. The apparatus of claim 7, wherein the master observe clock signal and the slave observe clock signal are non-overlapping signals.

9. An apparatus for circuit modeling for use with an automatic test pattern generator of a level sensitive scan design storage element and a non-level sensitive scan design storage element comprising:
   means for modeling the level sensitive scan design storage element;
   means for modeling the non-level sensitive scan design storage element; and
   flip-flop means for modeling the interface between the level sensitive scan design storage element and the non-level sensitive scan design storage element.

10. A method of modeling a level sensitive scan design storage element and a non-level sensitive scan design storage element for testing with an automatic test pattern generator comprising:
    generating a slave output signal from a slave element;
    generating a master input signal for a master element; and
    alternatively selecting the slave output signal and the master input signal with a master observe control module, wherein the master observe control module is a flip-flop circuit.

11. The method of claim 10, wherein the master observe control module models the interface between the level sensitive scan design storage element and the non-level sensitive scan design storage element.

12. The method of claim 10, wherein the master observe control module alternatively selects the master input signal and the slave output signal upon assertion of a slave observe clock signal.

13. The method of claim 12, wherein the slave element generates the slave output signal upon assertion of a master observe clock signal.

14. The method of claim 13, wherein the slave observe clock signal and the master observe clock signal are generated a single clock.

15. The method of claim 14, wherein the slave observe clock signal and the master observe clock signal are non-overlapping signals.

16. A method of modeling an L2 Star storage element and a Muxscan design storage element for testing with an automatic test pattern generator comprising:

receiving a master input signal for a master latch upon assertion of a write clock signal;

generating a slave output signal from a slave latch upon assertion of a master observe control signal;

alternatively latching the master input signal and the slave output signal with a master observe control module that models an interface between the L2 Star storage element and the Muxscan storage element, wherein the master observe control module alternatively latches the master input signal and the slave output signal upon assertion of a slave observe clock signal, and wherein the master observe control module is a flip-flop.

17. The method of claim 16, wherein the master observe clock signal and the slave observe clock signal are non-overlapping signals.

* * * * *